United States Patent
Oowada et al.

(10) Patent No.: US 8,130,551 B2
(45) Date of Patent: Mar. 6, 2012

(54) EXTRA DUMMY ERASE PULSES AFTER SHALLOW ERASE-VERIFY TO AVOID SENSING DEEP ERASED THRESHOLD VOLTAGE

(75) Inventors: Ken Oowada, Fujisawa (JP); Yingda Dong, San Jose, CA (US); Deepanshu Dutta, Santa Clara, CA (US)

(73) Assignee: SanDisk Technologies Inc., Plano, TX (US)

(*) Notice: Subject to any disclaimer, the term of this patent is extended or adjusted under 35 U.S.C. 154(b) by 225 days.

(21) Appl. No.: 12/751,265

(22) Filed: Mar. 31, 2010

(65) Prior Publication Data

US 2011/0242899 A1   Oct. 6, 2011

(51) Int. Cl.
 *G11C 16/04* (2006.01)
(52) U.S. Cl. .......... 365/185.19; 365/185.22; 365/185.29
(58) Field of Classification Search ............. 365/185.19, 365/185.22, 185.29
See application file for complete search history.

(56) References Cited

U.S. PATENT DOCUMENTS

| | | | |
|---|---|---|---|
| 5,400,286 A | 3/1995 | Chu et al. | |
| 6,590,811 B1 | 7/2003 | Hamilton et al. | |
| 6,643,184 B2 | 11/2003 | Pio | |
| 6,657,897 B2 * | 12/2003 | Watanabe et al. | 365/185.29 |
| 6,839,281 B2 * | 1/2005 | Chen et al. | 365/185.21 |
| 6,888,758 B1 | 5/2005 | Hemink et al. | |
| 7,200,708 B1 * | 4/2007 | Kreifels | 711/103 |
| 7,289,368 B2 | 10/2007 | Del Gatto et al. | |
| 7,403,424 B2 | 7/2008 | Hemink et al. | |
| 7,457,166 B2 | 11/2008 | Hemink et al. | |
| 8,036,044 B2 * | 10/2011 | Dong et al. | 365/185.29 |
| 2002/0121653 A1 | 9/2002 | Mihnea et al. | |
| 2003/0028709 A1 | 2/2003 | Micheloni et al. | |
| 2004/0013002 A1 | 1/2004 | Mun et al. | |
| 2004/0047198 A1 | 3/2004 | Lusky et al. | |
| 2004/0264250 A1 | 12/2004 | Zink et al. | |
| 2006/0158940 A1 | 7/2006 | Shappir et al. | |
| 2006/0221660 A1 | 10/2006 | Hemink et al. | |
| 2007/0133305 A1 | 6/2007 | Chae et al. | |
| 2007/0247922 A1 | 10/2007 | Lin | |
| 2009/0158994 A1 | 6/2009 | Miyanaga et al. | |

FOREIGN PATENT DOCUMENTS

EP   1306855 A2   5/2003

OTHER PUBLICATIONS

International Search Report & The Written Opinion of the International Searching Authority dated Jun. 22, 2011, International Application No. PCT/US2011/029240.

* cited by examiner

*Primary Examiner* — Pho M Luu
(74) *Attorney, Agent, or Firm* — Vierra Magen Marcus & DeNiro LLP

(57) ABSTRACT

An erase operation for non-volatile memory includes first and second phases. The first phase applies a series of voltage pulses to a substrate, where each erase pulse is followed by a verify operation. The verify operation uses a verify level which is offset higher from a final desired threshold voltage level. The erase pulses step up in amplitude until a maximum level is reached, at which point additional erase pulses at the maximum level are applied. The first phase ends when the verify operation passes. The second phase applies one or more extra erase pulses which are higher in amplitude than the last erase pulse in the first phase and which are not followed by a verify operation. This avoids the need to perform a verify operation at deep, negative threshold voltages levels, which can cause charge trapping which reduces write-erase endurance, while still achieving the desired deep erase.

20 Claims, 10 Drawing Sheets

EXTRA DUMMY ERASE PULSES AFTER SHALLOW ERASE-VERIFY TO AVOID SENSING DEEP ERASED THRESHOLD VOLTAGE

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

A programming operation typically begins will all non-volatile storage elements in an erased state. An erase operation involves applying a large positive voltage to the substrate to draw electrons out of the floating gates. However, achieving a deep, well controlled erase to negative threshold voltage levels can be problematic.

BRIEF DESCRIPTION OF THE DRAWINGS

FIG. 1b is an equivalent circuit diagram of the NAND string of FIG. 1a.

FIG. 1c is a cross-sectional view of the NAND string of FIG. 1a.

DETAILED DESCRIPTION

A method and non-volatile storage system are provided in which a deep erase operation is performed without the need to perform verify operations at the deepest threshold voltage levels.

An erase operation involves applying a series of voltage pulses to the substrate to draw electrons out of the floating gates of the storage elements and into the substrate. A first phase of the erase operation applies erase pulses to a set of storage elements, where each erase pulse is followed by a verify operation. The verify operation uses a verify level which is offset higher from a final desired threshold voltage level. The erase pulses in the first phase may step up in amplitude until a maximum level is reached, at which point additional erase pulses at the maximum level can be applied. Each of the additional erase pulses at the maximum level is followed by a verify operation. The first phase ends when the verify operation is successful. This may indicate, e.g., that those non-volatile storage elements in the set are in a conductive state. In this case, the threshold voltages of the non-volatile storage elements is below the verify level. A second phase of the erase operation applies one or more extra erase pulses which are different in amplitude than the last erase pulse in the first phase. For example, the extra erase pulses can be higher in amplitude. The one or more extra erase pulses have a specified step up in amplitude which is designed to cause the threshold voltages of the storage elements to reach the final desired threshold voltage level. Further, the one or more extra erase pulses are not followed by a verify operation. This avoids the need to perform a verify operation at deep, negative threshold voltages levels, which is problematic for reasons mentioned further below, while still achieving the desired deep erase.

One example of a memory system suitable for implementing the present invention uses the NAND flash memory structure, which arranges multiple transistors in series between two select gates. The transistors in series and the select gates are referred to as a NAND string.

Figure 1A:
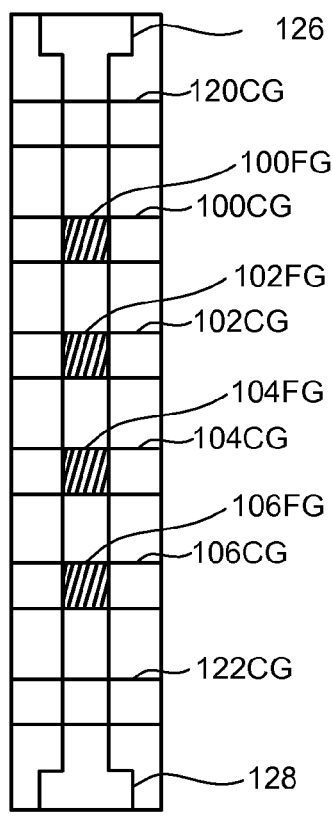
FIG. 1a is a top view of a NAND string.
Figure 1B:
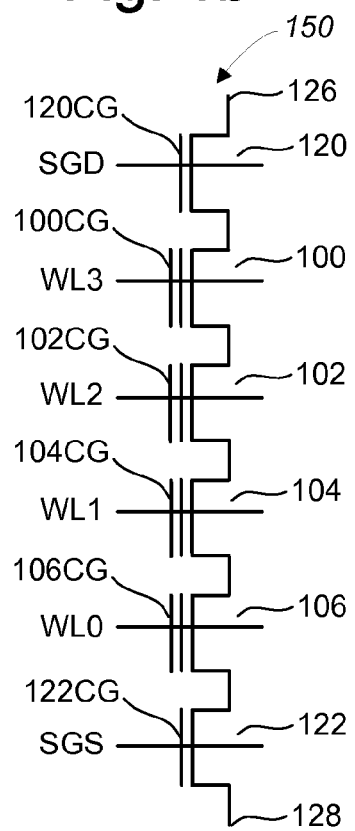

FIG. 1a is a top view showing one NAND string. FIG. 1b is an equivalent circuit diagram of the NAND string of FIG. 1a. The NAND string depicted in FIGS. 1a and 1b includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 1C:
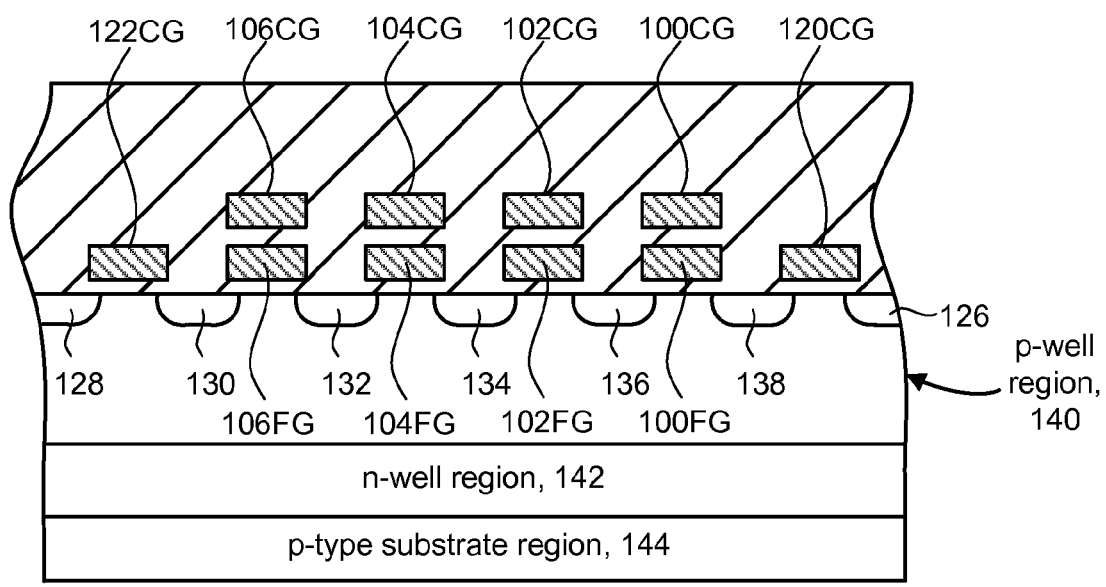

FIG. 1c is a cross-sectional view of the NAND string of FIG. 1a. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a-1c show four memory cells in the NAND string, the use of four transistors is provided only as an example. A NAND string used with the technology described herein can have less than four memory cells or more than four memory cells. For example, some NAND strings will include up to 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 2:
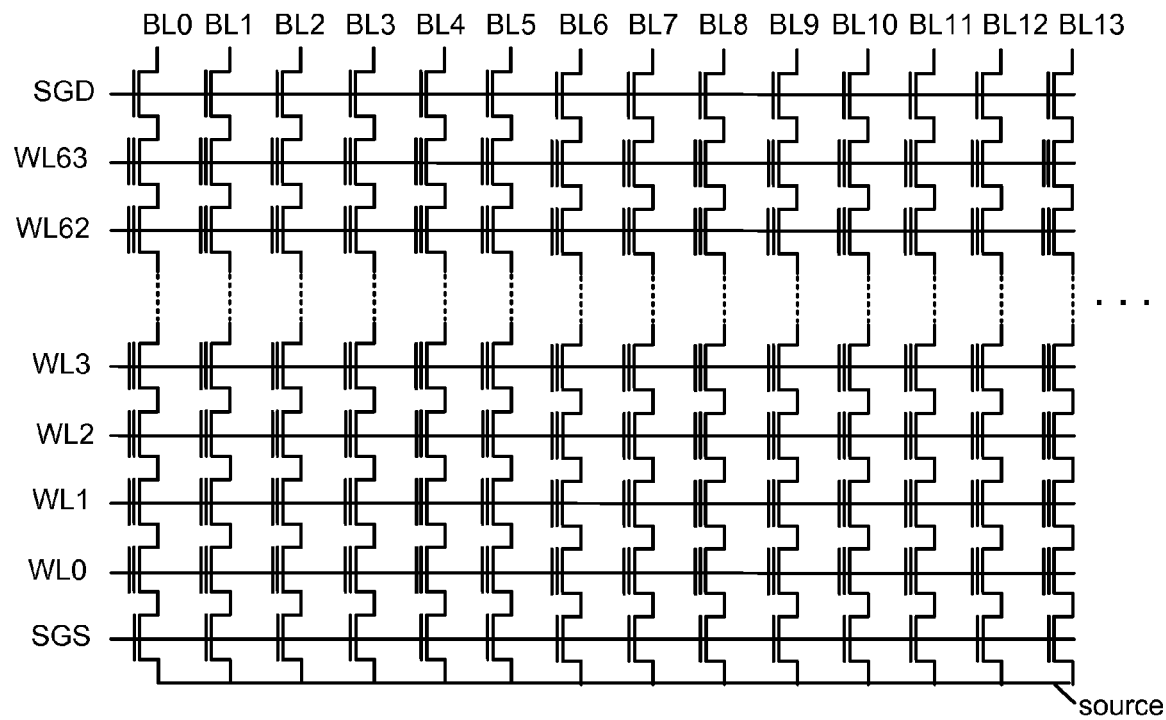
FIG. 2 depicts a block of NAND flash memory cells, where the block is made up of NAND strings such as depicted in FIGS. 1a-1c.

FIG. 2 depicts a block of NAND flash memory cells, where the block is made up of NAND strings such as depicted in FIGS. 1a-1c. The block includes a number of NAND strings and respective bit lines, e.g., BL0, BL1, . . . . Each NAND string is connected at one end to a drain select gate (SGD), and the control gates of the drain select gates are connected via a common SGD line. The NAND strings are connected at their other end to a source select gate which, in turn, is connected to a common source line. A number of word lines, including optional dummy word lines, extend between the source select gates and the drain select gates. In an example block, there are 8,512 columns corresponding to bit lines BL0, BL1, BL8511.

Figure 3:
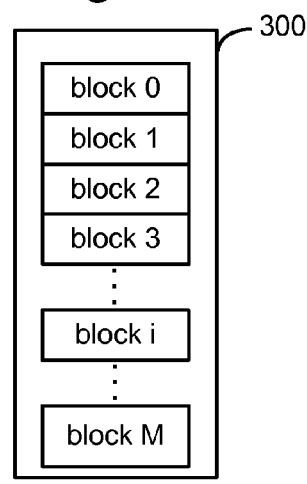
FIG. 3 depicts a memory array 300 comprising multiple blocks, such as the block of FIG. 2.

FIG. 3 depicts a memory array 300 comprising multiple blocks, such as the block of FIG. 2. As one example, a NAND flash EEPROM is described that is partitioned into M=1,024 blocks. The data stored in each block can be simultaneously erased. In one embodiment, the block is the minimum unit of storage elements that are simultaneously erased. Storage elements can be erased by raising the p-well to an erase voltage (e.g., 14-22 V) and grounding the word lines of a selected block while floating the source and bit lines. Erasing can be performed on the entire memory array, separate blocks, or another unit of the storage elements which is a portion of the memory device. During erasing, electrons are transferred from the floating gates of the storage elements to the p-well region so that the Vth of the storage elements becomes negative. A strong electric field is applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered.

Figure 4:
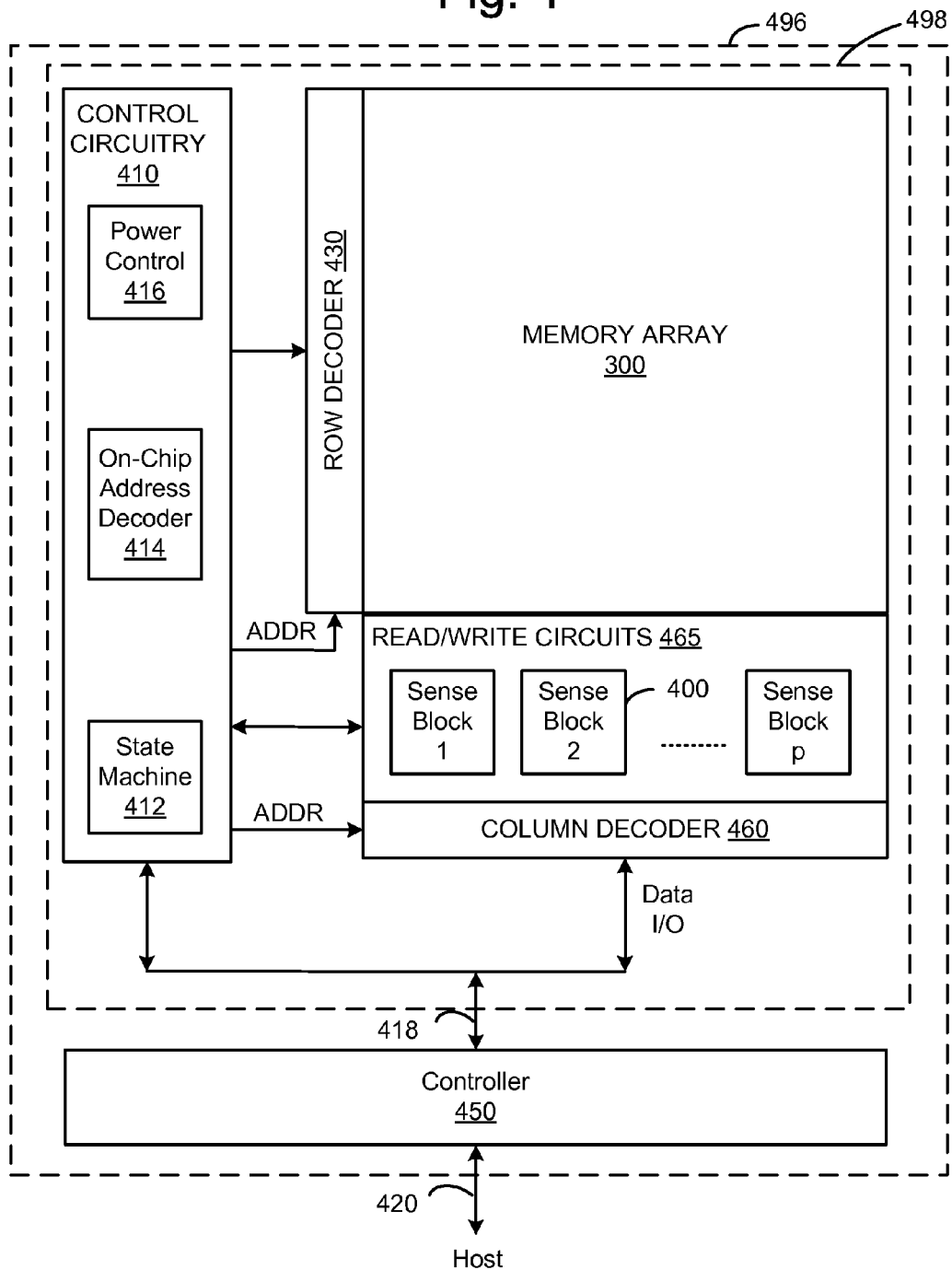
FIG. 4 is a block diagram of a non-volatile memory system using single row/column decoders and read/write circuits.

FIG. 4 is a block diagram of a non-volatile memory system using single row/column decoders and read/write circuits. The diagram illustrates a memory device 496 having read/write circuits for reading and programming a page of storage elements in parallel, according to one embodiment. Memory device 496 may include one or more memory die 498. Memory die 498 includes a two-dimensional array of storage elements 300, such as depicted in FIG. 3, control circuitry 410, and read/write circuits 465. In some embodiments, the array of storage elements can be three dimensional. The memory array 300 is addressable by word lines via a row decoder 430 and by bit lines via a column decoder 460. The read/write circuits 465 include multiple sense blocks 400 and allow a page of storage elements to be read or programmed in parallel. Typically a controller 450 is included in the same memory device 496 (e.g., a removable storage card) as the one or more memory die 498. Commands and Data are transferred between the host and controller 450 via lines 420 and between the controller and the one or more memory die 498 via lines 418.

The control circuitry 410 cooperates with the read/write circuits 465 to perform memory operations on the memory array 300. The control circuitry 410 includes a state machine 412, an on-chip address decoder 414, and a power control module 416. The state machine 412 provides chip-level control of memory operations. The on-chip address decoder 414 provides an address interface between that used by the host or a memory controller to the hardware address used by the decoders 430 and 460. The power control module 416 controls the power and voltages supplied to the word lines and bit lines during memory operations.

In some implementations, some of the components of FIG. 4 can be combined. In various designs, one or more of the components (alone or in combination), other than storage element array 300, can be thought of as a managing or control circuit. For example, one or more managing or control circuits may include any one of or a combination of control circuitry 410, state machine 412, decoders 414/460, power control 416, sense blocks 400, read/write circuits 465, controller 450, etc. The one or more managing or control circuits can provide erase operations as discussed herein.

In another embodiment, a non-volatile memory system uses dual row/column decoders and read/write circuits. Access to the memory array 300 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 300. In this way, the density of the read/write modules is essentially reduced by one half.

Figure 5:
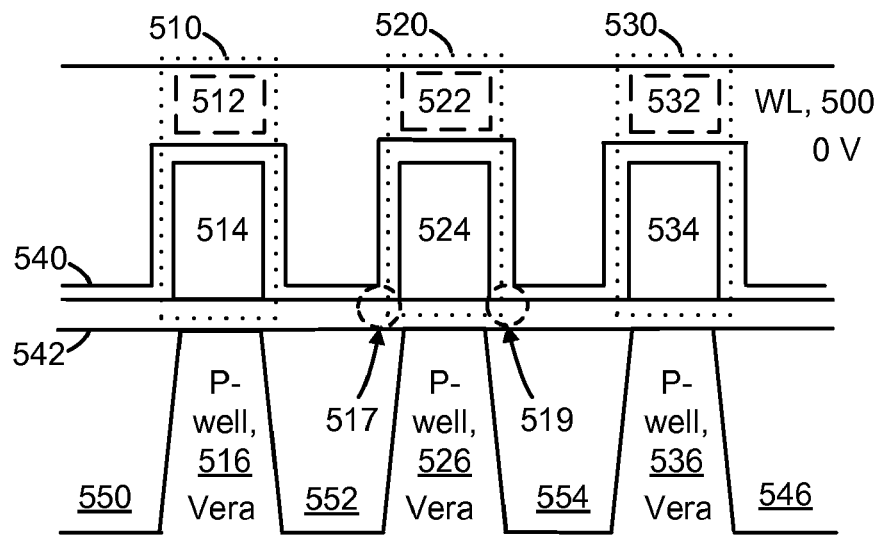
FIG. 5 is a cross section of NAND strings, and depicts charge trapping at edges of a floating gate.

FIG. 5 is a cross section of NAND strings, and depicts charge trapping at edges of a floating gate. The cross section depicts a control gate (CG) or selected word line 500 which extends across multiple storage elements in a word line direction. Each storage element includes a control gate and a floating gate (FG) which is over a respective channel area of the substrate, typically in a p-well. For example, a storage element 510 includes a control gate 512 and a floating gate 514 over a p-well channel region 516, a storage element 520 includes a control gate 522 and a floating gate 524 over a p-well channel region 526, and a storage element 530 includes a control gate 532 and a floating gate 534 over a p-well channel region 536. Each channel region is part of a NAND string which can be visualized as coming out of the page, in a bit line direction which is orthogonal to the word line direction. The p-well regions are separated by shallow trench isolation regions 550, 552, 554 and 556. An inter-poly dielectric (IPD) material 540 may be provided between each control gate and floating gate, while a tunnel oxide layer 542 is provided between each floating gate and a substrate region.

With ever-smaller dimensions of a scaled NAND or other memory device, especially for a multi-level cell (MLC), e.g., having four or more levels, floating gate-to-floating gate coupling effects, neighbor channel potential coupling effects and other program/read disturbs will increase. Because of these effects, the total Vth budget should be enlarged. Since a typical MLC NAND has no control over the erased Vth distribution after MLC programming, due to the various coupling noises and other disturbs, it is desirable for an erase verify to be performed at a highly negative Vth. However, at the same time, the erase Vth should not be too deeply negative, as this as can cause various reliability issues such as tunnel oxide break down, and additional charge trapping to various NAND cell surrounding areas, which is known to degrade write-erase (WE) endurance.

For example, in FIG. 5, regions 517 and 519 denote charge-trapping sites of the storage element 520. Charge trapping, e.g., trapping of electrons, can occur at a corner between the active area and the floating gate. The active area includes the source, drain and channel regions formed in the p-well. The charge trapping can form parasitic cells between the floating gates which impact the threshold voltage of a storage element. Specifically, the threshold voltage of a storage element will appear to be higher than it actually is, so that an erase operation will apply more erase pulses than is necessary. These additional pulses can degrade the tunnel oxide as write-erase cycles increase, thereby degrading the memory device. The charge trapping can increase with increasing write-erase cycles. Charge trapping can occur with each storage element, but is depicted for storage element 520 only for simplicity.

The erase techniques provided herein can be used with a memory that transfers charges, such as NAND flash memory, Metal-Oxide-Nitride-Oxide-Semiconductor (MONOS), Silicon-Oxide-Nitride-Oxide-Silicon (SONOS) or any charge-trapping type of memory.

Figure 6:
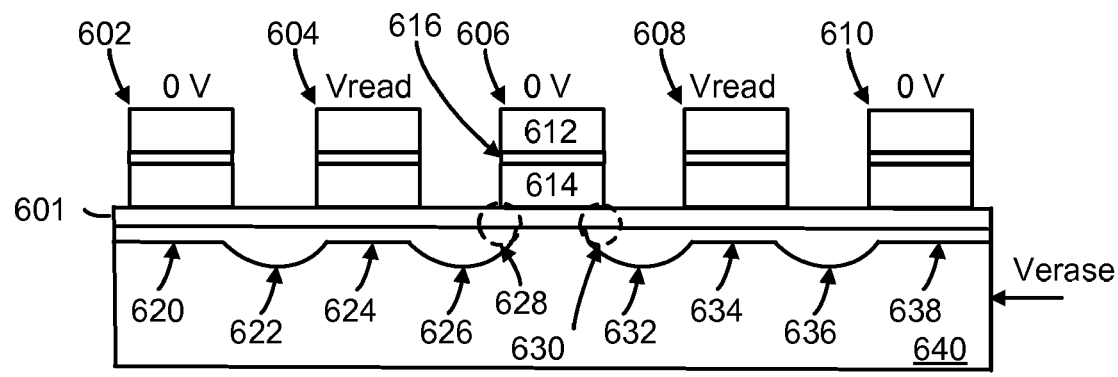
FIG. 6 depicts a cross-sectional view of a NAND string of FIG. 5, showing charge trapping at edges of a floating gate.

FIG. 6 depicts a cross-sectional view of a NAND string of FIG. 5, showing charge trapping at edges of a floating gate. The NAND string includes example storage elements 602, 604, 606, 608 and 610 formed on a tunnel oxide 601 on substrate 640. The storage elements include a control gate, floating gate and inter-poly dielectric (IPD), such as IPD 616.

Erase-verify operations include an all word line verify operation in which all word lines are verified concurrently, typically receiving 0 V, an alternate word line verify operation, in which alternate word lines are verified concurrently. An alternate word line verify operation is depicted in which a selected set of alternate word lines receive 0 V and an unselected set of alternate word lines receive a higher read voltage Vread, such as 2-8 V. For example, even-numbered word lines may receive 0 V while being verified, while odd-numbered word lines receive Vread. Odd-numbered word lines may receive 0 V while being verified, while even-numbered word lines receive Vread. In this example, storage elements 602, 606 and 610 are currently selected for verifying and receive 0 V via respective word lines, and storage elements 604 and 608 are currently unselected for verifying and receive Vread. Also, in this example, charge trapping regions 628 and 630 are depicted. The charge trapping regions prevent a conductive channel region from forming under the storage element 606 between the source/drain regions 626 and 632. Essentially, the control gate voltage 0 V does not exceed the threshold voltage of the storage element 606 plus the charge stored by the parasitic cells which are formed by the charge trapping.

In contrast, conductive channel regions are formed under the other storage elements. Specifically, a conductive channel region 620 forms under the storage element 602 between the source/drain region 622 and another source/drain region, not shown, a conductive channel region 624 forms under the storage element 604 between the source/drain regions 622 and 626, a conductive channel region 634 forms under the storage element 608 between the source/drain regions 632 and 636, and a conductive channel region 638 forms under the storage element 610 between the source/drain region 636 and another source/drain region, not shown. An erase voltage, Verase, is applied to the substrate 640.

Charge trapping can occur with each storage element, but is depicted for storage element 606 only for simplicity. Further details of an erase-verify operation are provided next.

Figure 7:
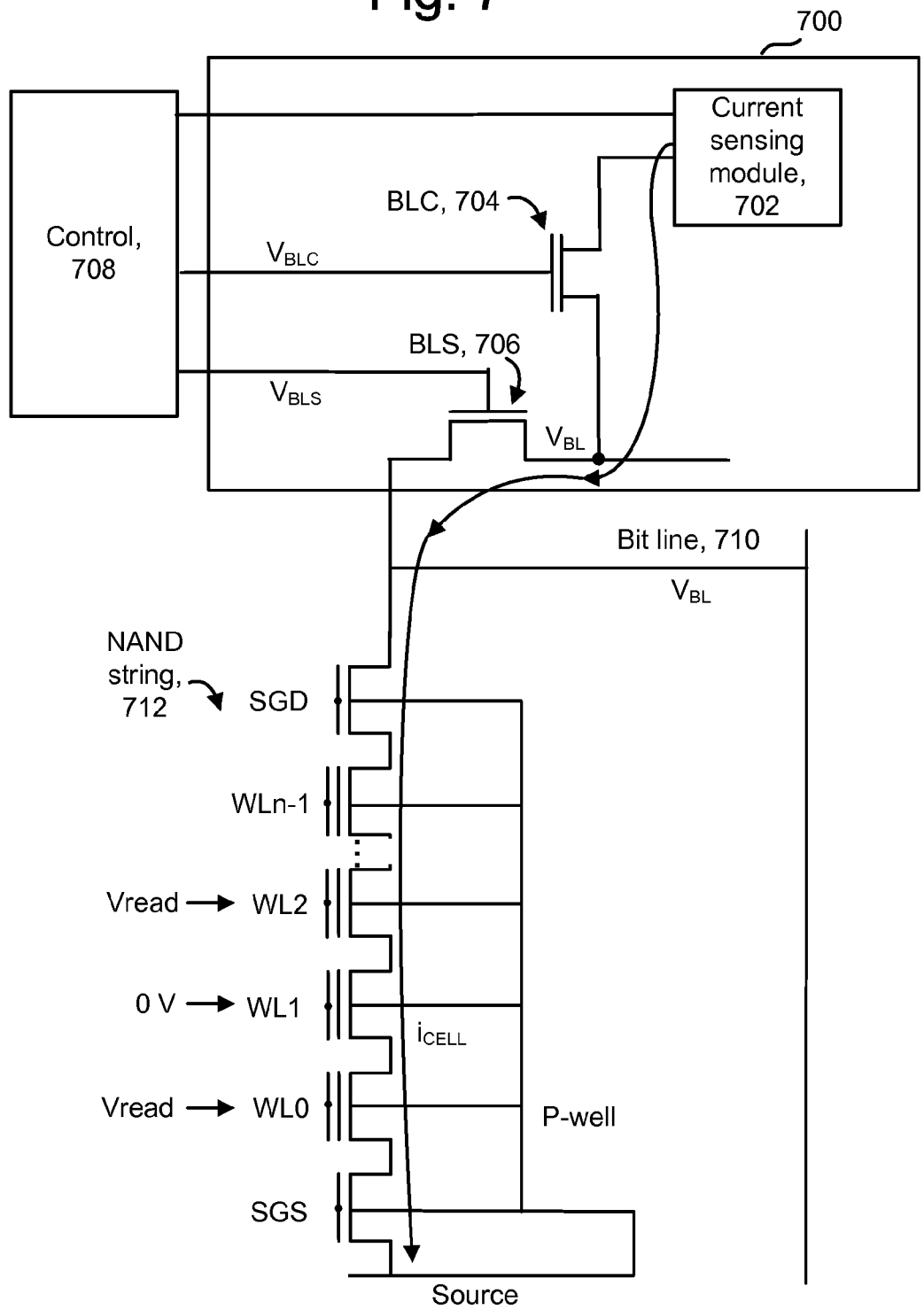
FIG. 7 depicts a configuration of a NAND string and components for erase-verify sensing with charging from the drain or bit line side.

FIG. 7 depicts a configuration of a NAND string and components for erase-verify sensing with charging from the drain or bit line side. A NAND string 712 includes n storage elements which are in communication with word lines WL0, WL1, WL2, . . . , WLn−1, respectively. Further, additional NAND strings are typically arranged adjacent to one another in a block or other set of non-volatile storage elements (see, e.g., FIG. 2). The storage elements are coupled to a p-well region of a substrate. A bit line 710 having a voltage $V_{BL}$ is depicted, in addition to sense component 700, which can be provided by the sense block 400 of FIG. 4.

A BLS (bit line sense) transistor 706 is coupled to the bit line 710. The BLS transistor 706 is a high voltage transistor, and is opened in response to a control 708 during sense operations. The control 708 can be provided by any of the control circuits discussed in connection with FIG. 4, for instance. A BLC (bit line clamp) transistor 704 is a low voltage transistor which is opened in response to the control 708 to allow the bit line to communicate with a current sensing module 702. During a sense operation, such as a verify operation which is part of an erase operation, a pre-charge operation occurs in which a capacitor in the current sensing module 702 is charged. The BLC transistor 704 may be made conductive to allow the pre-charging. Also during the sense operation, specified voltages are applied to the word lines. One example approach applies 0 V or Vread to alternating word lines. In this example, even-numbered word lines such as WL0, WL2, . . . receive Vread and odd-numbered word lines WL1, WL3, . . . receive 0 V, when the odd-numbered word lines WL1, WL3, . . . are verified during one part of an erase verify operation. During another part of the erase verify operation, odd-numbered word lines receive Vread and even-numbered word lines receive 0 V, when the even-numbered word lines are verified.

In an erase operation, an entire block may receive a common erase pulse. The verify operation can determine whether each NAND string is conductive. In one approach, all NAND strings are verified concurrently. In another possible approach, even-numbered NAND strings are verified separately from odd-numbered NAND strings. If all NAND strings are not conductive, an additional erase pulse can be applied. Moreover, for a given NAND string, each storage element must be conductive in order for the entire NAND string to be conductive, since the storage elements are series-connected in a NAND string.

In an example implementation, 0 V is applied to the word line even when a negative threshold voltage is sensed. This avoids the need for a negative charge pump to provide a negative word line voltage. However, a negative word line voltage could be used if available.

The voltage on the word line is coupled to the control gates of the storage elements on the word line as the control gate read voltage $V_{CGR}$. Further, a positive voltage $V_{SOURCE}$ can be applied to the source side of the NAND string 712 and a positive voltage $V_{P\text{-}WELL}$ can be applied to the p-well. $V_{SOURCE}$ and $V_{P\text{-}WELL}$ are greater than $V_{CGR}$, in one implementation. $V_{SOURCE}$ and $V_{P\text{-}WELL}$ can differ from one another, or they can be coupled to the same DC voltage, $V_{DC}$. Further, $V_{DC} > V_{CGR}$. As an example, $V_{DC}$ can be in the range of about 0.4 to 1.5 V, e.g., 0.8 V. A higher $V_{DC}$ allows sensing of more negative threshold voltage states. For example, a negative threshold voltage state $V_{TH} = -1.0$ V might be sensed using $V_{DC} = 1.5$ V. $V_{DC}$ can be set at a level such that $V_{DC} - V_{TH} > 0$ V. Generally, for sensing a negative threshold voltage, as occurs in an erase-verify operation, the word line and source voltages are set so that the gate-to-source voltage is less than zero, i.e., $V_{GS} < 0$ V. A storage element is conductive if the gate-to-source voltage is greater than the storage element's threshold voltage, i.e., $V_{GS} > V_{TH}$. For sensing a positive threshold voltage, the source and p-well can be kept at the same voltage while the selected word line voltage is adjusted.

At the drain side of the NAND string 712, the BLS transistor 706 is made conductive. Additionally, a voltage $V_{BLC}$ is applied to the BLC transistor 704 to make it conductive. The pre-charged capacitor in the current sensing module 702 discharges through the bit line and into the source so that the source acts as a current sink, when the NAND string is conductive, e.g., when the threshold voltages of all storage elements of the NAND string have reached below the erase-verify level. This is represented by the current $i_{cell}$. If the threshold voltage of one or more of the storage elements in the NAND string has not reached below the erase-verify level, little no current will flow in the NAND string.

The capacitor at the drain of the NAND string may be pre-charged to a potential which exceeds a potential of the source so that a current flows through the selected non-volatile storage element and sinks into the source when each storage element of the NAND string is in the conductive state. The current sensing module 702 can sense the cell/storage element current, $i_{CELL}$. In one possible approach, the current sensing module determines a voltage drop which is tied to a fixed current flow by the relationship $\Delta V = i_{CELL} \cdot t/C$, where $\Delta V$ is the voltage drop, $i_{CELL}$ is the fixed current, t is a predetermined discharge time period and C is the capacitance of the pre-charged capacitor in the current sensing module. A greater voltage drops represent higher currents. At the end of a given discharge period, since $i_{CELL}$ and C are fixed, $\Delta V$ for a given current can be determined. If the discharge is sufficiently large in a specified time, the NAND string is deemed to be conductive, so that each storage element is also conductive. That is, the threshold voltage of each storage element has reached below the erase-verify level. The current sensing module 702 thus can determine whether the associated NAND string is in a conductive or non-conductive state by the level of current.

In one approach, a p-mos transistor is used to determine a level of $\Delta V$ relative to a demarcation value. In another possible approach, a cell current discriminator serves as a discriminator or comparator of current levels by determining whether the conduction current is higher or lower than a given demarcation current.

Voltage sensing, in contrast, does not involve sensing a voltage drop which is tied to a fixed current. Instead, voltage sensing involves determining whether charge sharing occurs between a capacitor in a voltage sensing module and a capacitance of the bit line. Current is not fixed or constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly. See FIG. 8 for an example of voltage sensing.

Figure 8:
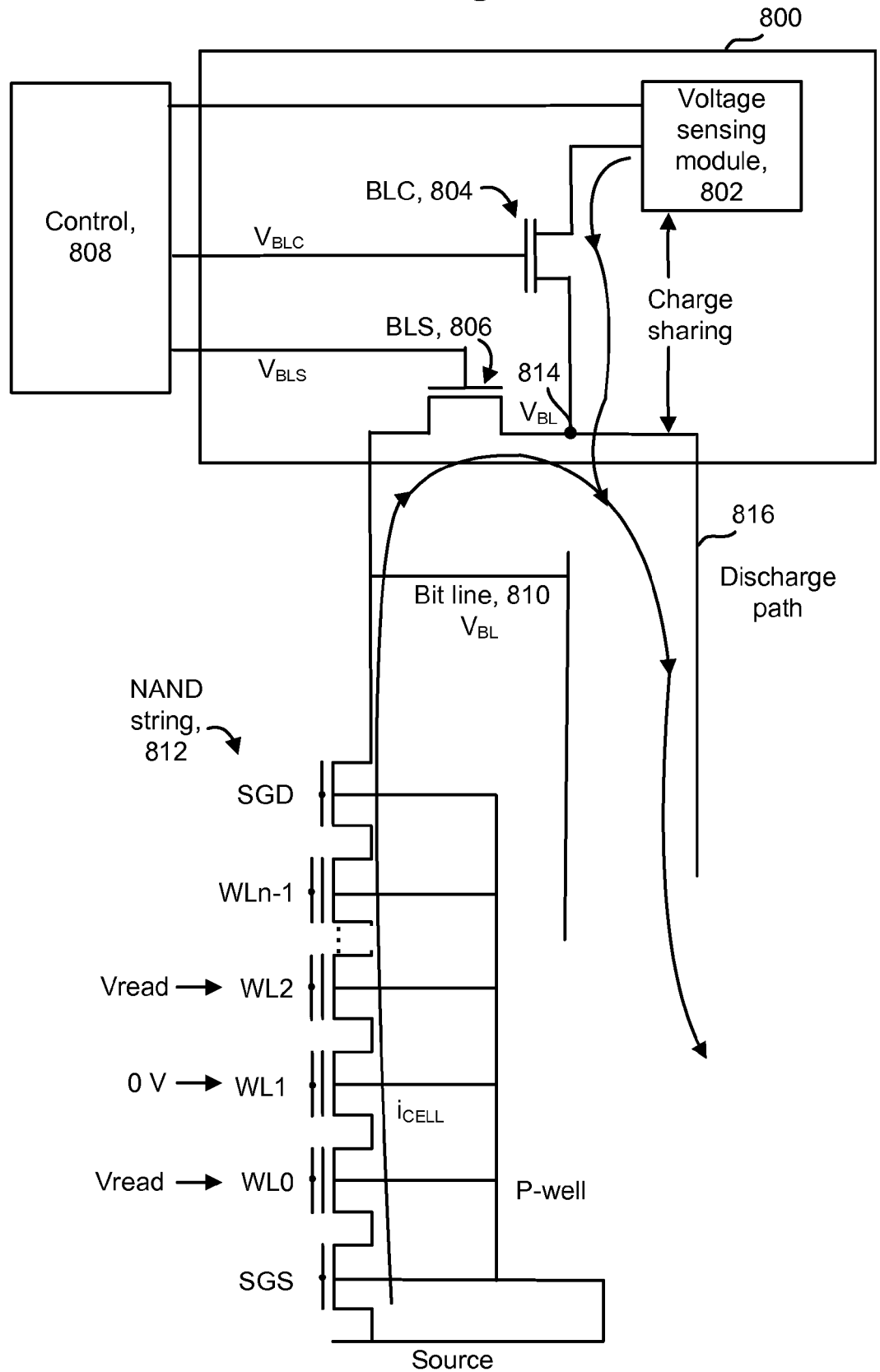
FIG. 8 depicts a configuration of a NAND string and components for erase-verify sensing with charging from the source line side.

FIG. 8 depicts a configuration of a NAND string and components for erase-verify sensing with charging from the source line side. This is also referred to as Source Follower Sensing (SFS). The configuration is similar to that in FIG. 7, except a voltage sensing module 802 is used instead of a current sensing module. A sensing module 800, control 808, BLC transistor 804, BLS transistor 806, bit line 810 and NAND string are provided, similar to the like-named components of FIG. 7. A sense node 814 is also depicted.

The BLS transistor 806, which is initially conductive, is coupled to the bit line 810 via a sense node 814. The BLS transistor 806 is a high voltage transistor, and is made conductive in response to a control 808 during sense operations. The BLC transistor 804, which is non-conductive initially, is a low voltage transistor which is opened in response to the control 808 to allow the bit line to communicate with a voltage sensing module/circuit 802. During a sense operation, such as a read or verify operation, a pre-charge operation occurs in which a capacitor in the voltage sensing module 802 is charged. The BLC transistor 804 may be opened to allow the pre-charging. A discharge path 816 may be provided, e.g., using a current pull down device.

During sensing, a positive voltage is applied to the source line of a NAND string so that the bit line will charge up to a level which is based on the threshold voltages of the storage elements in the NAND string 812. With a negative threshold voltage, the storage element will be conductive even with a $V_{GCR}=0$ V. $V_{P\text{-}WELL}$ may be set to 0 V.

When the bit lines reach their DC levels, the BLC transistor 804 is made conductive to allow charge sharing between the voltage sensing module 802 and the sense node 814 so that voltage sensing of the threshold voltage of the selected storage element can occur. Current flows from the voltage sensing module 802 toward the discharge path. Also, the voltage at the source line is sufficient to cause current ($i_{CELL}$) to flow through the NAND string 812 when the threshold voltages of the storage elements in the NAND string have reached below the erase-verify level.

Thus, each verify operation charges a source line and determines whether the source line discharges through at least one non-volatile storage element of the set of non-volatile storage elements by at least a specified amount in a specified time period. See also FIG. 9.

Despite the need for a deeply negative and well controlled erase Vth in scaled memory device, a typical erase verify scheme has its own limitations. A NAND device can be erased in a unit of a block, and use a Source Follower Sensing (SFS) method to sense a negative Vth, where bit lines are charged to an erase verify level, Vsenev from a common source line which is pre-charged to Vdd. The erase verify is considered to have a pass or success status when all the selected bit lines are charged to the Vsenev level within a specified time period. Thus, an increase of Vsenev will allow an erase verify at a more negative Vth. However, sensing at a higher Vsenev will become a problem as NAND or other memory devices scale to smaller dimensions because of a heavier bit line capacitance to charge up under a given limited time, and will be also limited by the source line Vdd margin which minimizes the cell current sense margin during sensing. This SFS scheme can be expressed by: icell=Cbit line * (Vdd−Vsenev)/tsense, where icell is the cell current during the erase verify sensing, Cbit line is the capacitance of the bit line and tsense is time needed to charge up the bit line to Vsenev.

Additionally, charge trapping to the floating gate surrounding area can impact the Vth of the floating gate and degrade the write-erase endurance. For example, as mentioned, charge trapping which occurs due to write-erase cycling creates parasitic cells at the floating gate edges. During page read mode, the given word line, WLn, will be biased to a designated read level between states while an unselected word line (including WLn adjacent neighbors) will be biased to Vread, which is sufficiently high to turn on or make conductive the channel under the unselected word line. The selected word line WLn and unselected WLn neighbor bias combination determines the amount of parasitic cell conductance, as a higher word line bias coupling to the cell junction area will hide the impact of these parasitic cells more. However, under an implementation of an erase verify operation in which all word lines are biased to 0 V, this is the worst case for parasitic cells to contribute to the floating gate Vth, and icell during sensing will be reduced.

To counter this effect, a higher word line bias during erase verify will act as the bias to turn on or make conductive the parasitic cell and increase icell during sensing. Another similar countermeasure is to use an alternate word line erase-verify sensing method, which applies a high voltage such as Vread (similar to an unselected word line bias during page read mode) to the alternating word lines that are not currently being erase-verified, while the other half of the alternating word lines to be verified are biased to 0 V or a very low voltage, which also gives a similar or greater impact to the parasitic cell turn on effect depending on word line biasing conditions. However, as a drawback to these countermeasures, a higher Vsenev may be required because sensed Vth will be higher when word lines are biased to higher voltage. Specifically, when the selected control gate bias is higher, it is easier for the selected channel to conduct. Thus, the sensed Vth will increase. As a result, Vsenev must be increased sufficiently to keep same erase Vth depth. This leads to difficulties in providing an erase verify at deep negative Vth for a scaled NAND device or other memory device. This also suggests that any other erase verify method that requires a low word line bias will suffer from the parasitic cell issue and directly degrade the write-endurance characteristics.

Another write-endurance issue is cell degradation due to high Verase, e.g., the erase voltage applied to the substrate. In one implementation, each voltage pulse of Verase can increase by a step size ΔVerase. In general, cell degradation is determined by two factors for the erase side: (1) Fowler-Nordheim tunneling influence during every erase. With a deeper erase (a more negative Vth), tunneling influence increases, and cells degrade faster. (2) The cell degradation is also determined by the highest Verase reached during erase. When Verase is sufficiently high, weak tunneling likely occurs between the floating gate-to-active area corners. In this case, cells degrade quickly even there is not much Fowler-Nordheim tunneling through the tunnel oxide. In the above case (2), where the final value of Verase reaches a relatively high value, using a small ΔVerase will increase the chance of charge trapping. If, for example, charge trapping occurs with Verase=20V, and final required Verase to pass erase verify is 21 V, then with ΔVerase=0.5 V, a total of three charge trapping stress events occur, when erase pulses of 20 V, 20.5 V and 21 V are applied. In contrast, if ΔVerase=1 V, a total of two charge trapping stress events occur, when erase pulses of 20 V and 21 V are applied. This suggests that increasing ΔVerase as much as possible is desirable. However, due to the above factor (1), we should not over erase. These higher/lower ΔVerase requirements from above two factors contradict each other. In order to counter both at the same time, a sufficiently high enough Verase pulse, which is not so high that it causes an over erase, can be applied after a relatively shallow (less negative Vth) erase verify.

In particular, one or more extra erase pulses can be applied following a shallow erase. An extra erase pulse (or blind or dummy erase pulse) is an erase pulse which is not followed by an associated verify operation. This approach can realize a sufficiently deep negative erase Vth without sensing at too deep a negative Vth, where this sensing is known to degrade write-erase endurance. Also, one can minimize multiple high Verase stresses that can accelerate the charge trapping effect and at the same time avoid over-erasing that also impacts write-erase cycle degradation.

In contrast, a deep negative erase Vth was not needed for under scaled devices (devices which larger dimensions) because floating gate-to-floating gate and neighbor channel coupling effects were negligibly small. Also, the previously mentioned higher word line bias during erase verify was not needed since charge trapping impact to the floating gate Vth was negligibly small. Overall, a deep erase Vth erase verify was not needed for under scaled NAND devices.

In an example implementation, the erase operation applies an initial voltage pulse of Verase to the p-well for a Fowler-Nordheim tunneling erase which draws electrons out of the floating gate and into the p-well. The erase pulse is followed by an associated erase-verify but at a higher Vth than the target depth of the erase Vth. If the erase-verify status is a fail, then we step up Verase by a step size ΔVerase. By performing an erase-verify at a higher level than the target Vth, a selected word line WLn and its neighbor WL bias will be high enough (e.g., at Vread) to avoid or reduce the impact of a parasitic cell Vth. This shallower (less negative Vth) erase verify will be beneficial under SFS mode, for instance, as it can directly lower the Vsenev bias which improves SFS operation margin.

After the shallow Vth erase verify status has passed, one or more extra stepped up erase pulses are provided. In one approach, an extra erase pulse has a magnitude which is higher than the last erase pulse Verase by a step ΔVextra, so that the storage elements move to a deeper negative Vth than the verified Vth level. This movement may be about ΔVextra. When multiple extra pulses are used, a more gradual step can be used, compared to when a single extra erase pulse is used, to avoid a strong electric field stress to the NAND cell. But, in any case, a negative erase verify Vth which is so deep that it degrades the write-erase endurance or other cell reliabilities can be avoided by this method.

A sufficiently deep negative erased Vth can be provided as, generally, the erase Vth decrement amount is proportional to the increment of ΔVerase. This also avoids a too deep negative erase which also is a NAND scaling concern, as a too deep negative Vth for NAND can cause various reliability issues such as oxide break down, and additional charge trapping to various NAND cell surrounding areas which degrade write-erase endurance. An advantage is that erasing to a sufficiently deep negative Vth is achieved without having to sense at a deep negative Vth. This avoids an excessive Verase increase during write-erase cycling, thus directly improving write-erase endurance.

Figure 9:
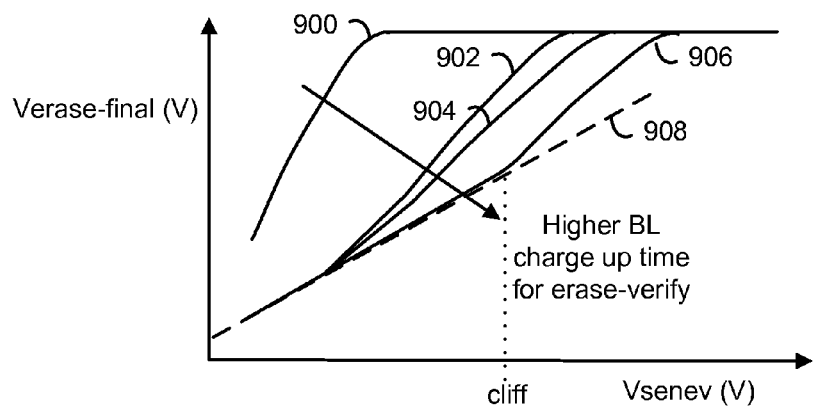
FIG. 9 depicts a final erase voltage versus a sense voltage using the erase-verify sensing of FIG. 7.

FIG. 9 depicts a final erase voltage versus a sense voltage using the erase-verify sensing of FIG. 7. As mentioned in connection with FIG. 7, an SFS erase-verify sensing scheme can apply a source voltage which charges up a bit line within a specified time when the verify passes. Lines 900, 902, 904 and 906 are associated with increasing bit line charge up times. The x-axis depicts Vsenev, the level to which the bit lines are charged by the source line. The y-axis depicts Verase-final, the final value of Verase needed to pass erase verify at different values of Vsenev and bit line charge up times. Verase-final is associated with the last loop of a number of erase loops. The word line bias is 0 V. As Vsenev increases, initially the increase in Verase-final is linear, as depicted by the dashed line, but at higher values of Vsenev, it shows a non-linearity, starting at a "cliff" voltage. The trend becomes worse when bit line charge up time is reduced. This shows that the time given for the source line bias to charge back up to Vdd is not sufficient under high Vsenev and hence erase verify must be deeper, using a higher Verase. With further scaling of a NAND device, this problem is expected to become worse.

Figure 10:
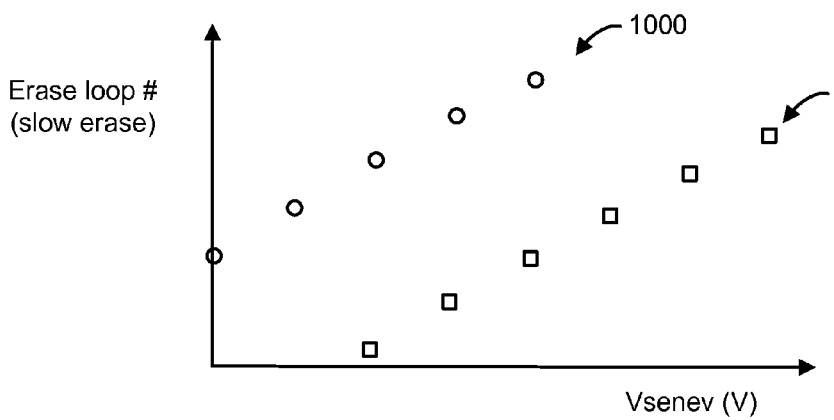
FIG. 10 depicts an erase loop number versus sense voltage.

FIG. 10 depicts an erase loop number versus sense voltage. The data points 1000, represented by circles, depict all word line verifying, where all word lines are set at 0 V. The data points 1010, represented by squares, depict alternate word line verifying (where 0 V is applied to alternate word lines/storage elements which undergo verifying, and Vread is applied to the other alternate word lines/storage elements). A slow erase operation is performed with a small Verase step size such as 0.25 V to detect the linearity of Vsenev vs. Erase loop #. Data for a fresh memory device without cycling stress is depicted. On the y-axis, the erase loop number represents the final depth of the erase. The case of alternate word lines/storage elements being verified separately results in higher Vsenev than the case of all word lines/storage elements grounded and verified together, for a given loop #. This is due to coupling of the voltage Vread from the adjacent neighbor word lines to the floating date of the verified storage element. Due to this coupling, the sensing Vth will be higher.

Figure 11:
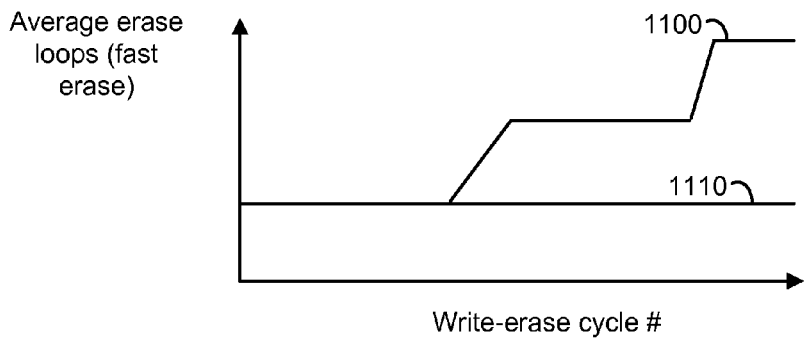
FIG. 11 depicts an average number of erase loops as a function of write-erase cycle number.

FIG. 11 depicts an average number of erase loops as a function of write-erase cycle number. The data applies to a fast erase operation which is experienced by the end user. Curve 1100 depicts the case of all word line erase verify using 0 V on the word lines, and a lower value of Vsenev. Curve 1110 depicts the case of alternate word line verifying and a higher value of Vsenev. The x-axis for the Vsenev values is the same in FIGS. 10 and 11 so that there is an equivalent erase verified Vth depth when the device is fresh. The alternate word line verifying (curve 1110) is much more stable in that is has less write-erase loop degradation (less write-erase window closure), compared to the all word line verifying (curve 1100), where both the selected word line WLn and the WLn neighbor are biased to 0 V. Note that WLn selected bias for sensing is 0 V for both cases.

Figure 12:
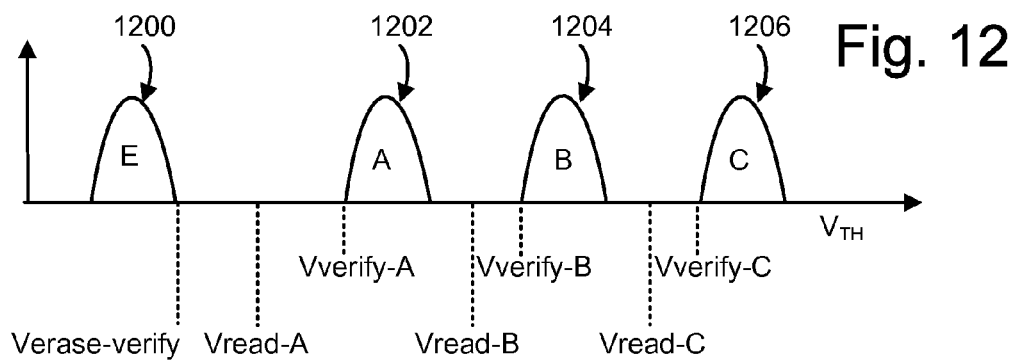
FIG. 12 depicts an example set of threshold voltage distributions.

FIG. 12 depicts threshold voltage distributions of an erased state and higher data states. The x-axis indicates a threshold voltage and the y-axis indicates a number or population of storage elements. In this example, there are four data states: an erased (E) state 1200, an A state 1202, a B state 1204 and a C state 1206. Memory devices with additional data states, e.g., eight or sixteen data states, or fewer states, e.g., two states, can also be used. An erase sequence can include optional pre-programming, an erase operation and an optional soft programming operation. In the erase operation, one or more erase pulses are applied to the substrate until the threshold voltage of the storage elements being erased transitions below an erase verify level, Verase-verify. Once the erase operation is completed, the soft programming operation can be performed, in which a number of positive voltage pulses are applied to the control gates of the storage elements, such as via a word line, to increase the threshold voltages of some or all of the storage elements in the distribution closer to and below a soft programming verify level (not shown), which is typically above or equal to Verase-verify. Once the soft programming operation is complete, programming to higher data states can occur, such as to states A, B and C using verify levels Vverify-A, Vverify-B and Vverify-C, respectively. A subsequent read operation for these higher states can use the levels Vread-A, Vread-B and Vread-C.

Figure 13:
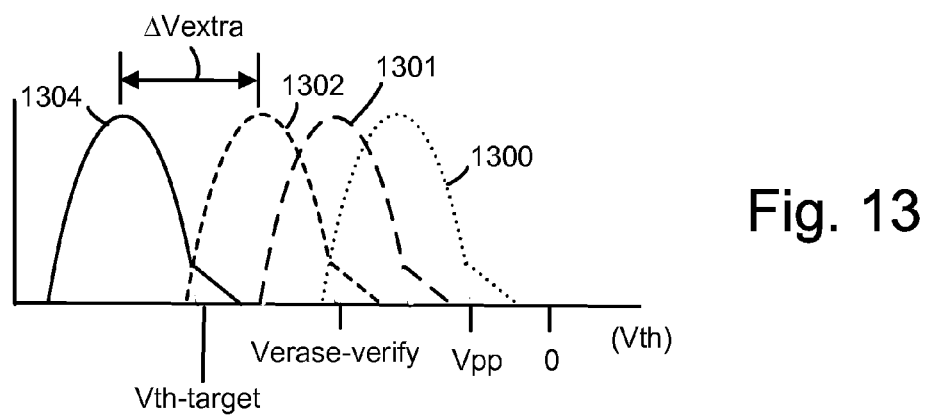
FIG. 13 depicts threshold voltage distributions for an erase operation where a single extra erase pulse is used.

FIG. 13 depicts threshold voltage distributions for an erase operation where a single extra erase pulse is used. The x-axis indicates a threshold voltage and the y-axis indicates a number or population of storage elements. Distribution 1300 occurs after pre-programming (pp) using a verify level of Vpp to normalize the Vth. Note that the distribution has a tail which represents a number of storage elements (bit ignore) whose Vth remains above Vpp when the verify operation has been completed. Next, distribution 1301 occurs after a first erase pulse of an erase operation which uses a verify level of Verase-verify. Next, distribution 1302 occurs after a last erase pulse of the first phase of the erase operation which started with the distribution 1301. In this case, the verify test has passed, even though the Vth is not yet at a desired target level, Vth-target. Next, distribution 1304 is achieved after an extra erase pulse is applied which is stepped up by ΔVextra from the last erase pulse of the first phase of the erase operation. The shift from the distribution 1302 to the distribution 1304 is about the same as, or proportional to, ΔVextra. This shift is shown as a difference between the peaks of the distributions 1302 and 1304, which is substantially the same as the difference between Vth-target and Vverify. The extra erase pulse is not followed by a verify operation, but is designed to achieve Vth-target, which is below Verase-verify, thereby achieving the benefits of a deep erase without the disadvantages, as discussed previously, of verifying at the deep erase level.

Figure 14:
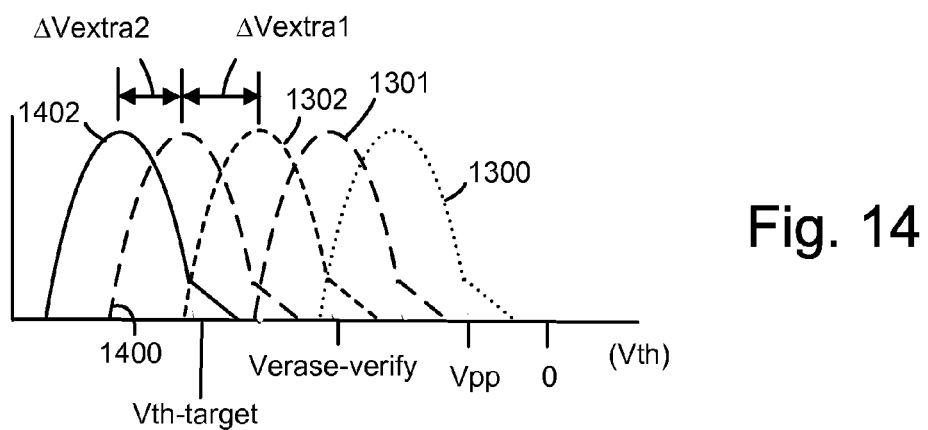
FIG. 14 depicts threshold voltage distributions for an erase operation where two extra erase pulses are used.

FIG. 14 depicts threshold voltage distributions for an erase operation where two extra erase pulses are used. The like-numbered distributions are the same as in FIG. 13. After distribution 1302 is achieved, the second phase of the erase operation occurs. Here, distribution 1400 is achieved after a first extra erase pulse is applied which is stepped up by ΔVextra1 from the last erase pulse of the first phase of the erase operation. The shift from the distribution 1302 to the distribution 1400 is about the same as, or proportional to, ΔVextra1. This shift is shown as a difference between the peaks of the distributions 1302 and 1400. Next, distribution 1402 is achieved after a second extra erase pulse is applied which is stepped up by ΔVextra2 from the first extra erase pulse. The shift from the distribution 1400 to the distribution 1402 is about the same as, or proportional to, ΔVextra2. This shift is shown as a difference between the peaks of the distributions 1400 and 1402. The extra erase pulses can have the same step up, e.g., ΔVextra1=ΔVextra2, or they can differ. The extra erase pulses are not followed by verify operations. This technique allows erasing sufficiently deep without the need for sensing at a deep negative Vth. The one or more extra erase pulses safely erase the storage elements to a target Vth without sensing at the target Vth.

Compared to the use of a single extra erase pulse, the use of multiple extra erase pulses results in a more gradual electrical field stress to the storage elements, although erase time is incrementally increased. A control parameter can be set in the control for the number of extra erase pulses to be issued.

Figure 15:
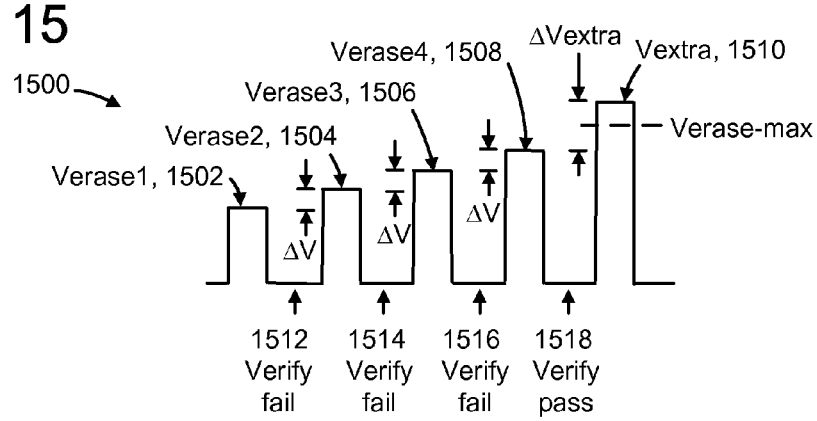
FIG. 15 depicts an example waveform in an erase operation in which a single extra pulse is used after nominal erase pulses which do not reach a maximum.

FIG. 15 depicts an example waveform in an erase operation in which a single extra pulse is used after nominal erase pulses which do not reach a maximum. The waveform 1500 includes multiple nominal erase pulses, Verase1 (1502), Verase2 (1502), Verase3 (1504), Verase4 (1506), which are each followed by a verify operation at time points depicted by arrows 1512, 1514, 1516 and 1518, respectively. A nominal erase pulse is an erase pulse which is followed by an associated verify operation, and is applied in the first phase of the erase operation. Further, after the first erase pulse Verase1, each nominal erase pulse steps up in amplitude by ΔV relative to the prior erase pulse. After the last nominal erase pulse 1508, an extra erase pulse Vextra (1510) is applied, in the second phase of the erase operation. Vextra (1510) steps up by ΔVextra from the last nominal erase pulse 1508, and is not followed by a verify operation. Verase-max represents a maximum allowed amplitude for the nominal erase pulses which are followed by a verify operation. Verase-max is lower than an absolute maximum allowable erase voltage in a memory device. The nominal erases pulses are applied until a verify pass status is achieved. In this example, a verify fail status is obtained after Verase1, Verase2 and Verase3, and a verify pass status is obtained after Verase4.

Optionally, some but not all of the erase pulses are stepped up in amplitude, and/or different step sizes can be used. Moreover, before the extra erase pulses are applied, it is possible to have one or more erase pulses which are not followed by a verify operation, followed by one or more erase pulses which are followed by a verify operation, followed by one or more extra pulses. For example, some erase-verify schemes may not perform a verify operation for the first one or more erases pulses.

Figure 16:
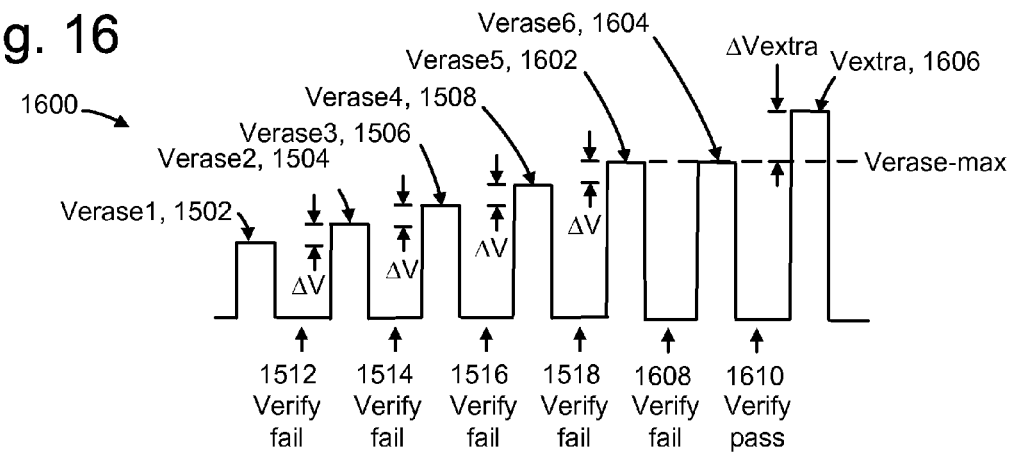
FIG. 16 depicts an example waveform in an erase operation in which a single extra pulse is used after nominal erase pulses which reach a maximum, based on the example distribution of FIG. 13.

FIG. 16 depicts an example waveform in an erase operation in which a single extra pulse is used after nominal erase pulses which reach a maximum, based on the example distribution of FIG. 13. The like-numbered elements are the same as in FIG. 15. In waveform 1600, a verify fail status is received for the verify operations after each of Verase1-Verase4, so that additional nominal erase pulses Verase5 (1602) and Verase6 (1604) are applied. However, Verase5 is at Verase-max. The verify operation after Verase5 also results in a verify fail status. Since no higher amplitude is allowed for the nominal erase pulses, the next nominal erase pulse, Verase6 is also at Verase-max. In this example, the verify operation after Verase6 results in a verify pass status. Generally, any number of nominal erase pulses at Verase-max, up to a specified limit, can be used until a verify pass is achieved. Subsequently, a single erase pulse Vextra 1606 is applied in this example, having a step up of ΔVextra from the last nominal pulse, Verase6 (1604).

The at least one extra erase pulse can be stepped up from a last erase pulse of the plurality of nominal erase pulses by a specified amount, ΔVextra, which is more than a step up amount (ΔV) used by the plurality of nominal erase pulses. As mentioned in connection with FIG. 13, ΔVextra can be set based on a difference between Vverify-erase and the target threshold voltage level Vth-target.

Figure 17:
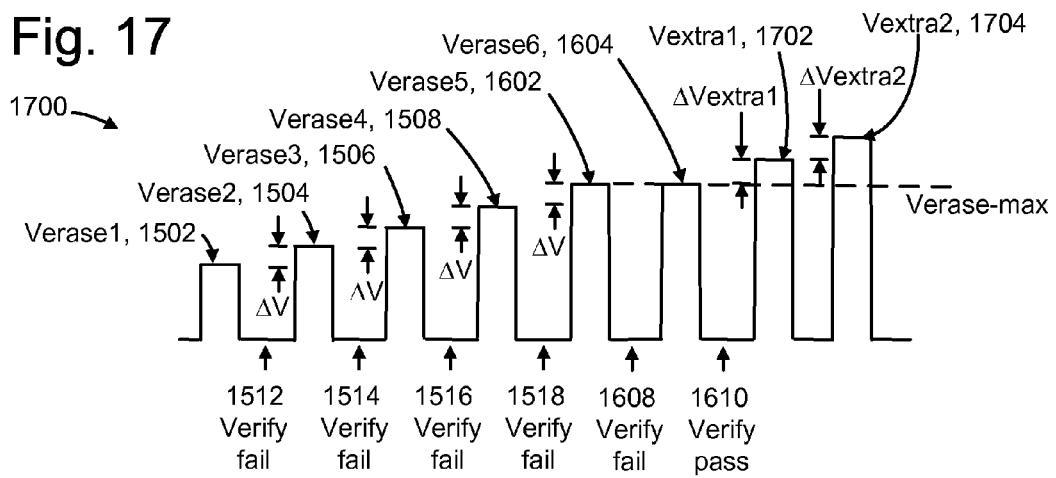
FIG. 17 depicts an example waveform in an erase operation in which two extra pulses are used after nominal erase pulses which reach a maximum, based on the example distribution of FIG. 14.

FIG. 17 depicts an example waveform in an erase operation in which two extra pulses are used after nominal erase pulses which reach a maximum, based on the example distribution of FIG. 14. The like-numbered elements are the same as in FIGS. 15 and 16. In waveform 1700, after the last nominal erase pulse, Verase6, is applied, a first extra erase pulse, Vextra1 (1720), is applied having a step up of ΔVextra1 from the last nominal erase pulse, followed by a second extra erase pulse, Vextra2 (1704), having a step up of ΔVextra2 from Vextra1.

When multiple extra erase pulses are applied, as mentioned, more extra erase pulses can reduce the stress on the storage element, per pulse, while incrementally increasing erase time. Similarly, fewer extra erase pulses can increase the stress on the storage element, per pulse, while incrementally reducing erase time. Moreover, the extra erase pulses can have the same step up, e.g., $\Delta$Vextra1=$\Delta$Vextra2, or they can differ. In one approach, the extra erase pulses are stepped up from a last erase pulse of the plurality of nominal erase pulses by a specified amount, $\Delta$Vextra1=$\Delta$Vextra2, which is more than a step up amount ($\Delta$V) used by the plurality of nominal erase pulses. Also, the second extra erase pulse Vextra2 is stepped up from the first extra erase pulse Vextra1 by at least the specified amount ($\Delta$Vextra2$\geq$$\Delta$Vextra1), in one possible approach.

Here, the first extra erase pulse Vextra1 is stepped up from a last erase pulse Verase6 of the plurality of nominal erase pulses by a specified amount $\Delta$Vextra1 which is more than an amount $\Delta$V by which the last erase pulse Verase6 of the plurality of erase pulses is stepped up from a next-to-last erase pulse Verase5 of the plurality of erase pulses. Also, the second extra erase pulse Vextra2 is stepped up from the first extra erase pulse.

Note that the one or more extra erase pulses can be a fixed number of erase pulses which are not followed by an associated verify operation. The fixed number of erase pulses is applied to the substrate regardless of whether the verification of the set of non-volatile storage elements is completed before the multiple nominal erase pulses reach the maximum voltage. The fixed number of extra erase pulses is associated with a fixed step up in amplitude. This is in contrast to an alternative scenario, e.g., in which the number and/or step up of the one or more extra erase pulses is larger when the amplitude of the last nominal erase pulse is larger. In this alternative scenario, an absolute maximum voltage is enforce. However, the use of a fixed number and/or step up of erase pulses is believed to result in a more reliable Vth shift to the desired target Vth from Verase-verify. Potentially, with increased write-erased cycles, the Vth shift for a given extra erase pulse can decrease so that it could be desirable for the number and/or step up of erase pulses to also increase.

In an example implementation, Verase1 is 14-18 V, the step size is 0.5-1.0 V, Verase-max is 20 V, the memory device erase voltage limit is 22 V, $\Delta$Vextra when used is 2 V, and $\Delta$Vextra1 and $\Delta$Vextra2 when used are each 1 V.

Figure 18:
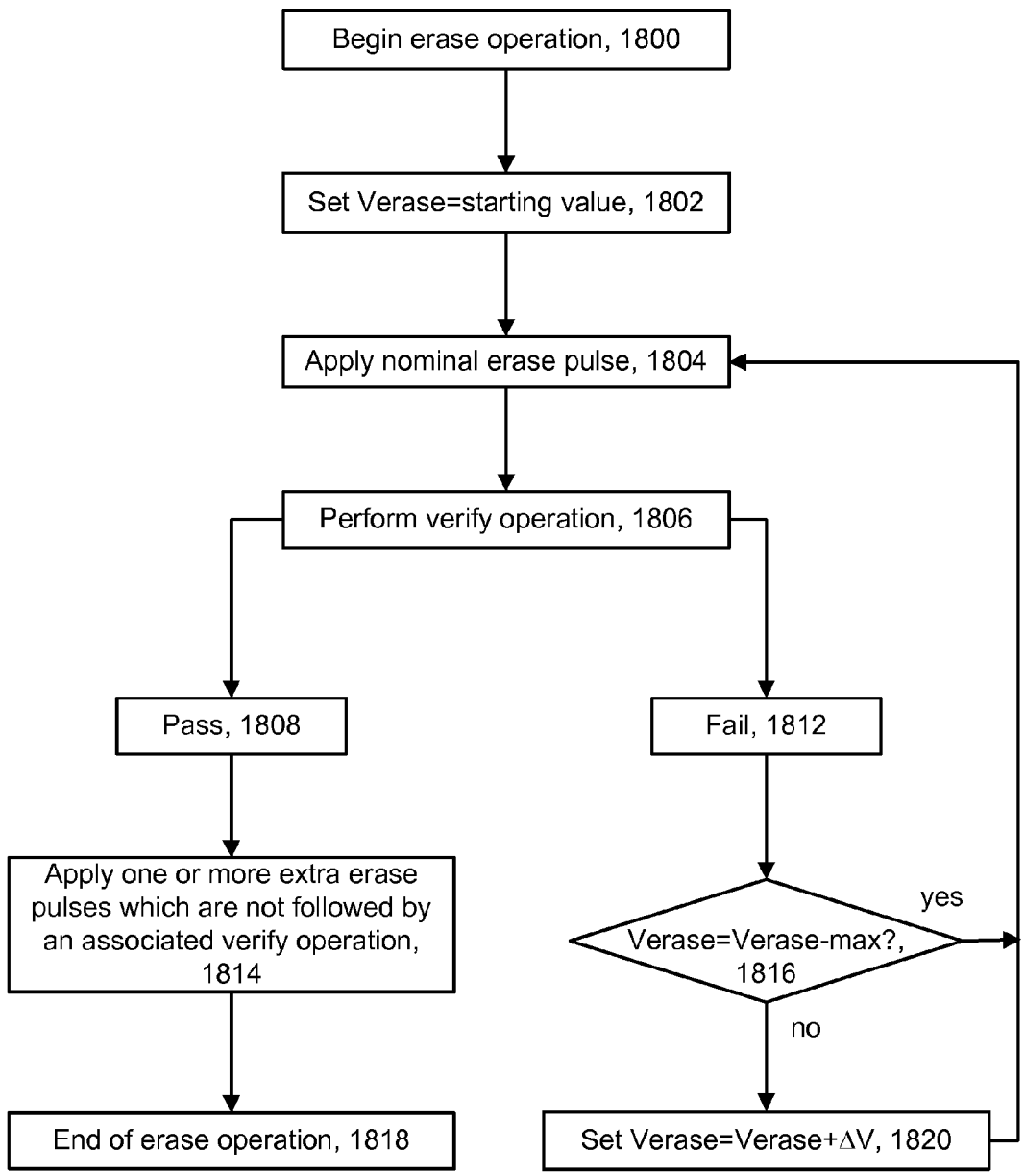
FIG. 18 depicts an example erase operation.

FIG. 18 depicts an example erase operation. The erase operation begins at step 1800. Verase is set to a starting value at step 1802. A nominal erase pulse is applied to the substrate at step 1804. Each nominal pulse applied at step 1804 represents a loop through the process. A verify operation is performed at step 1806. The verify operation can determine whether at least one non-volatile storage element in a set of non-volatile storage elements is conductive, for instance. This can involve determine whether a NAND string is conductive, for instance.

If the verify operation passes (step 1808), step 1814 applies one or more extra erase pulses which are not followed by an associated verify operation, and the erase operation ends at step 1818. Thus, no further verify operations are performed for the erase operation. If the verify operation fails (step 1812), decision step 1816 determine whether Verase=Verase-max. If decision step 1816 is true, an additional erase pulse is applied having the same maximum amplitude at step 1804. Thus, Verase-max is enforced as a maximum amplitude which the nominal erase pulses cannot exceed. If decision step 1816 is false, step 1820 steps up Verase by $\Delta$V, and an additional erase pulse is applied having the stepped up amplitude at step 1804.

As described above, Verase-max can be defined at the erase verify operation loop, and not at the end of the one or more extra pulses. This allows a sufficient margin to apply the one or more extra erase pulses to shift down the erase verified Vth to the target depth, without exceeding the absolute maximum voltage that memory device can tolerate. This absolute maximum is typically defined by either the physical electrical field limit to the storage element such as based on IPD leakage, or by a high voltage transfer gate break down level. Moreover, an additional margin can be applied so that the highest extra erase pulse possible is below the absolute maximum voltage that memory device can tolerate. For example, Verase-max=20 V, highest allowed Vextra is 22 V and absolute maximum voltage that memory device can tolerate is 24 V.

In one embodiment of the technology described herein, a method is provided for performing an erase operation in a non-volatile storage system. The method includes applying a plurality of nominal erase pulses to a substrate of a set of non-volatile storage elements, where the plurality of erase pulses include erase pulses which increase step-wise in amplitude. The method further includes enforcing a maximum voltage which the plurality of erase pulses cannot exceed. The method further includes performing a verify operation involving the set of non-volatile storage elements after each erase pulse of the plurality of erase pulses, where each verify operation determines whether at least one string of non-volatile storage elements in the set of non-volatile storage elements is conductive. The method further includes, in response to determining that the at least one string of non-volatile storage elements in the set of non-volatile storage elements is conductive, applying at least one extra erase pulse to the substrate of the set of non-volatile storage elements which is not followed by an associated verify operation, the at least one extra erase pulse is stepped up from a last erase pulse of the plurality of erase pulses.

In another embodiment, a non-volatile storage system includes a set of non-volatile storage elements, and at least one control circuit in communication with the set of non-volatile storage elements. The at least one control circuit, to perform an erase operation, applies a plurality of erase pulses to the substrate. The plurality of erase pulses include erase pulses which increase step-wise in amplitude until an erase pulse at a maximum voltage is applied, after which one or more additional erase pulses are applied at the maximum voltage until the set of non-volatile storage elements pass a verify test using an erase-verify level. In response to the set of non-volatile storage elements passing the verify test, the at least one control circuits applies at least one extra erase pulse to the substrate of the set of non-volatile storage elements which is not followed by an associated verify operation, where the at least one extra erase pulse is stepped up from a last erase pulse of the plurality of erase pulses.

In another embodiment, a method for performing an erase operation in a non-volatile storage system includes applying a plurality of erase pulses to a substrate of a set of non-volatile storage elements, where the plurality of erase pulses include erase pulses which increase step-wise in amplitude until an erase pulse at a maximum voltage is applied, after which one or more additional erase pulses are applied at the maximum voltage until the set of non-volatile storage elements pass a verify test using an erase-verify level. The method further includes, in response to the set of non-volatile storage elements passing the verify test, applying at least one extra erase pulse to the substrate of the set of non-volatile storage elements which is not followed by an associated verify operation, the at least one extra erase pulse is stepped up from a last erase pulse of the plurality of erase pulses.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for performing an erase operation in a non-volatile storage system, comprising:
applying a plurality of erase pulses to a substrate of a set of non-volatile storage elements, the plurality of erase pulses include erase pulses which increase step-wise in amplitude;
enforcing a maximum voltage which the plurality of erase pulses cannot exceed;
performing a verify operation involving the set of non-volatile storage elements after each erase pulse of the plurality of erase pulses, each verify operation determines whether at least one non-volatile storage element in the set of non-volatile storage elements is conductive; and
in response to determining that the at least one non-volatile storage element is conductive, applying at least one extra erase pulse to the substrate of the set of non-volatile storage elements which is not followed by an associated verify operation, the at least one extra erase pulse is stepped up from a last erase pulse of the plurality of erase pulses.

2. The method of claim 1, wherein:
the at least one extra erase pulse is stepped up by an amount which is based on a difference between: (a) a target threshold voltage level (Vth-target) which is to be reached upon completion of the erase operation, and (b) a verify level (Verase-verify) of the verify operation.

3. The method of claim 1, wherein:
the at least one extra erase pulse is stepped up from a last erase pulse of the plurality of erase pulses by a specified amount which is more than a step up amount used by the plurality of erase pulses.

4. The method of claim 1, wherein:
the maximum voltage is enforced such that a last erase pulse of the erase pulses which increase step-wise in amplitude has the maximum voltage, and is followed by at least one other erase pulse of the plurality of erase pulses having the maximum voltage until the at least one non-volatile storage element in the set of non-volatile storage elements is determined to be conductive.

5. The method of claim 1, wherein:
the applying at least one extra erase pulse to the substrate comprises applying a fixed number of erase pulses to the substrate which are not followed by associated verify operations, including at least first and second extra erase pulses.

6. The method of claim 1, wherein:
a first extra erase pulse of the at least one extra erase pulse is stepped up from a last erase pulse of the plurality of erase pulses by a specified amount which is more than an amount by which the last erase pulse of the plurality of erase pulses is stepped up from a next-to-last erase pulse of the plurality of erase pulses; and
the second extra erase pulse is stepped up from the first erase pulse.

7. The method of claim 6, wherein:
a second extra erase pulse of the at least one extra erase pulse is stepped up from the first extra erase pulse by at least the specified amount.

8. The method of claim 1, wherein:
the applying at least one extra erase pulse to the substrate comprises applying a fixed number of one or more erase pulses to the substrate which are not followed by an associated verify operation, the fixed number of erase pulses are applied to the substrate regardless of whether the verification of the set of non-volatile storage elements is completed before the plurality of erase pulses reach the maximum voltage.

9. The method of claim 1, wherein:
the set of non-volatile storage elements are associated with a common a word line in a memory array; and
the performing of the verify operations includes applying 0 V to the common word line while applying a higher voltage to adjacent word lines, while the adjacent word lines do not undergo verify operations.

10. The method of claim 1, wherein:
each verify operation charges a source line and determines whether the source line discharges through at least one non-volatile storage element of the set of non-volatile storage elements by at least a specified amount in a specified time period.

11. A non-volatile storage system, comprising:
a set of non-volatile storage elements formed on a substrate; and
at least one control circuit in communication with the set of non-volatile storage elements, the at least one control circuit, to perform an erase operation, applies a plurality of erase pulses to the substrate, the plurality of erase pulses include erase pulses which increase step-wise in amplitude until an erase pulse at a maximum voltage is applied, after which one or more additional erase pulses are applied at the maximum voltage until the set of non-volatile storage elements pass a verify test using an erase-verify level, and in response to the set of non-volatile storage elements passing the verify test, the at least one control circuits applies at least one extra erase pulse to the substrate of the set of non-volatile storage elements which is not followed by an associated verify operation, the at least one extra erase pulse is stepped up from a last erase pulse of the plurality of erase pulses.

12. The non-volatile storage system of claim 11, wherein:
the at least one extra erase pulse is stepped up by an amount which is based on a difference between: (a) a target threshold voltage level (Vth-target) which is to be reached upon completion of the erase operation, and (b) a verify level (Verase-verify) of the verify operation.

13. The non-volatile storage system of claim 11, wherein:
the at least one control circuit, to apply the at least one extra erase pulse to the substrate, applies a fixed number of one or more erase pulses to the substrate which are not followed by an associated verify operation, the fixed number of erase pulses are applied to the substrate regardless of whether the verify test is passed for the set of non-volatile storage elements before the plurality of erase pulses reach the maximum voltage.

14. The non-volatile storage system of claim 11, wherein:
the set of non-volatile storage elements are associated with a common a word line in a memory array; and the performing of the verify operations includes applying 0 V to the common word line while applying a higher voltage to adjacent word lines, while the adjacent word lines do not undergo verify operations.

15. The non-volatile storage system of claim 11, wherein:

each verify operation charges a source line and determines whether the source line discharges through at least one non-volatile storage element of the set of non-volatile storage elements by at least a specified amount in a specified time period.

16. A method for performing an erase operation in a non-volatile storage system, comprising:

applying a plurality of erase pulses to a substrate of a set of non-volatile storage elements, the plurality of erase pulses include erase pulses which increase step-wise in amplitude until an erase pulse at a maximum voltage is applied, after which one or more additional erase pulses are applied at the maximum voltage until the set of non-volatile storage elements pass a verify test using an erase-verify level; and in response to the set of non-volatile storage elements passing the verify test, applying at least one extra erase pulse to the substrate of the set of non-volatile storage elements which is not followed by an associated verify operation, the at least one extra erase pulse is stepped up from a last erase pulse of the plurality of erase pulses.

17. The method of claim 16, wherein:

the at least one extra erase pulse is stepped up by an amount which is based on a difference between: (a) a target threshold voltage level (Vth-target) which is to be reached upon completion of the erase operation, and (b) a verify level (Verase-verify) of the verify operation.

18. The method of claim 16, wherein:

the applying at least one extra erase pulse to the substrate comprises applying a fixed number of one or more erase pulses to the substrate which are not followed by an associated verify operation, the fixed number of erase pulses are applied to the substrate regardless of whether the verify test is passed for the set of non-volatile storage elements before the plurality of erase pulses reach the maximum voltage.

19. The method of claim 16, wherein:

the set of non-volatile storage elements are associated with a common a word line in a memory array; and the performing of the verify operations includes applying 0 V to the common word line while applying a higher voltage to adjacent word lines, while the adjacent word lines do not undergo verify operations.

20. The method of claim 16, wherein:

each verify operation charges a source line and determines whether the source line discharges through at least one non-volatile storage element of the set of non-volatile storage elements by at least a specified amount in a specified time period.

* * * * *